(12) United States Patent
Schrödinger

(10) Patent No.: US 7,358,799 B2
(45) Date of Patent: Apr. 15, 2008

(54) SWITCHABLE HIGH PASS CONFIGURATION AND AN OPTICAL RECEIVER WITH A SWITCHABLE HIGH PASS CONFIGURATION

(75) Inventor: Ing. Karl Schrödinger, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 72 days.

(21) Appl. No.: 11/104,707

(22) Filed: Apr. 13, 2005

(65) Prior Publication Data
US 2007/0001755 A1 Jan. 4, 2007

(51) Int. Cl.
*H03K 5/00* (2006.01)

(52) U.S. Cl. ..................... 327/552; 327/559

(58) Field of Classification Search ........ 327/551–559, 327/336, 344
See application file for complete search history.

(56) References Cited

U.S. PATENT DOCUMENTS

| | | | | |
|---|---|---|---|---|
| 4,306,198 A | * | 12/1981 | Okada | 330/260 |
| 4,853,610 A | * | 8/1989 | Schade, Jr. | 323/316 |
| 4,888,502 A | * | 12/1989 | Jarrett | 327/553 |
| 5,751,185 A | * | 5/1998 | Yamamoto et al. | 327/558 |
| 5,864,256 A | * | 1/1999 | Dick et al. | 327/552 |
| 6,091,289 A | * | 7/2000 | Song et al. | 327/558 |
| 6,130,719 A | * | 10/2000 | Hebbalalu et al. | 348/529 |
| 6,437,639 B1 | * | 8/2002 | Nguyen et al. | 327/558 |
| 6,462,527 B1 | * | 10/2002 | Maneatis | 323/315 |
| 6,731,160 B1 | * | 5/2004 | Behzad | 327/559 |
| 6,744,307 B2 | * | 6/2004 | Ikeda et al. | 327/559 |
| 6,882,216 B2 | * | 4/2005 | Kang | 327/552 |

OTHER PUBLICATIONS

U.S. Appl. No. 11/104,708, filed Apr. 13, 2005, Schrödinger.

* cited by examiner

*Primary Examiner*—Dinh T. Le
(74) *Attorney, Agent, or Firm*—Workman Nydegger

(57) ABSTRACT

The invention relates to a switchable high-pass filter arrangement which has a lower limiting frequency determining the high-pass filter behavior. The arrangement includes a transistor circuit, which has at least one transistor in a common-gate or common-base connection; a capacitive component in series with the input of the transistor circuit; and a programmable device for setting the operating current of the transistor circuit. In this case, the limiting frequency of the high-pass filter arrangement is switchable by means of the programmable device for setting the operating current of the transistor circuit. This creates a switchable high-pass filter arrangement which does not have any changeover switches in the signal path, is suitable for radiofrequency applications and can be produced in a simple manner. The invention furthermore relates to an optical receiver having a high-pass filter arrangement of this type.

16 Claims, 4 Drawing Sheets

SWITCHABLE HIGH PASS CONFIGURATION AND AN OPTICAL RECEIVER WITH A SWITCHABLE HIGH PASS CONFIGURATION

FIELD OF THE INVENTION

The invention relates to a switchable high-pass filter arrangement having a capacitive component, which does not require any changeover switches in the signal path and which is thus suitable for radiofrequency applications in optical receivers. The invention furthermore relates to an optical receiver having a high-pass filter arrangement of this type.

BACKGROUND OF THE INVENTION

Switchable high-pass filter arrangements are known which are constructed as electrical circuits by means of resistors and capacitors and which may be designed as simple RC elements. Such RC elements have a capacitor in series with an input and a resistor in parallel with an output of the arrangement. The high-pass filter behavior of such arrangements is described by a lower limiting frequency determined by the values of the resistor and of the capacitor. Signals above said limiting frequency which are present at the high-pass filter arrangement are not substantially influenced and are transmitted unchanged, but signals below the limiting frequency are attenuated and thus largely suppressed.

For switching of such high-pass filter arrangements, the resistor of the circuit may be designed to be switchable by means of changeover switches that are produced for example by means of field effect transistors using MOS technology. What is disadvantageous about such arrangements is that the changeover switches have parasitic capacitances, in particular with the use of field effect transistors using MOS technology. The parasitic capacitances act in series with the resistor, bridge the changeover switch for radiofrequency signals and thus form together with the resistor a parasitic low-pass filter arrangement that disturbs the behavior of the high-pass filter arrangement. Such arrangements are therefore unsuitable for radiofrequency applications.

FIG. 1 shows a switchable high-pass filter arrangement known in accordance with the prior art, which arrangement has parallel-connected resistors 40, 40' and a capacitor 30. The arrangement filters a signal that is present at the input 10 and is transmitted to the output 20, in such a way that the high-frequency components of the signal are not influenced, but the low-frequency components are attenuated.

Situated in series with the resistor 40 is a changeover switch 50, which is switched by means of a switching signal 60 and DC-isolates the resistor 40 from the circuit and thus renders it inactive. As a result of the changeover of the switch 50, the resistance that takes effect in the signal path is altered and the limiting frequency of the arrangement is thus shifted. The changeover switch 50 may be realized by using, for example, field effect transistors produced using MOS technology. Since the changeover switch 50 is arranged in series with the resistor 40, the transistor components of the changeover switch 50, which have a parasitic capacitance 50', act in series with the resistor 40, bridge the changeover switch 50 for radiofrequency signals and form with the resistor a separate parasitic RC element that has a low-pass filter characteristic and adversely influences the behavior of the high-pass filter arrangement.

Therefore, there is a need for switchable high-pass filter arrangements, in particular for optical receivers, which avoid the parasitic effects of the changeover switches, are suitable for radiofrequency applications, have low losses and can be produced in a simple manner.

SUMMARY OF THE INVENTION

The invention provides a switchable high-pass filter arrangement which has a lower limiting frequency determining the high-pass filter behavior of the arrangement, having a transistor circuit, which has at least one transistor in a common-gate or common-base connection, a capacitive component in series with the input of the transistor circuit, and a programmable device for setting the operating current of the transistor circuit.

In this case, the limiting frequency of the high-pass filter arrangement is switchable by means of the programmable device for setting the operating current of the transistor circuit.

The invention is thus based on the concept of using the transistor circuit designed as a common-gate or common-base connection together with a capacitive component for example in the form of a capacitor as a high-pass filter arrangement and setting the limiting frequency of the high-pass filter arrangement by setting the operating current of the transistor circuit. The operating current of the transistor circuit is set by means of the programmable device, which is designed in such a way that it has different, switchable states which in each case bring about a different operating current, so that the operating current can be set and hence the limiting frequency of the high-pass filter arrangement can be switched by means of the state of the device. The high-pass filter arrangement according to the invention utilizes the behavior of the transistor circuit which is designed as a common-gate or common-base connection and the input resistance of which interacts with the capacitive component arranged in series with the input of the transistor circuit in such a way that the arrangement has a high-pass filter characteristic similar to an RC element, the input resistance of the transistor circuit and thus the high-pass filter characteristic of the arrangement being variable by means of the setting of the operating current, that is to say the setting of the operating point of the transistor circuit.

The changeover between different limiting frequencies is effected by means of the programmable device for setting the operating current, that is to say the operating point of the transistor circuit, which, in principle, may be designed like a switchable current source and thus defines the operating point, sets the output resistance of the transistor circuit and hence determines the limiting frequency of the high-pass filter arrangement.

The high-pass filter arrangement can be interpreted as a switchable RC element, in which case, with the high-pass filter arrangement according to the invention, there is no need for any changeover switches for switching components in the signal path, losses are reduced and the effective parasitic capacitances are reduced. The high-pass filter arrangement according to the invention is thus also suitable for radiofrequency applications in the gigahertz range, for example as a switchable high-pass filter for an optical receiver that can be switched in terms of the lower limiting frequency.

The device for setting the operating current preferably contains an additional transistor which is fed by means of a switchable voltage source and thus acts like a switchable current source. The transistor is connected to the transistor circuit designed as a common-gate or common-base connection, forms a cascode circuit with the transistor of the transistor circuit and thus sets the operating current of the transistor circuit.

The device for setting the operating current is preferably designed as a programmable current mirror which, in its simplest embodiment, has two transistors that can be coupled with negative feedback by resistors, and which is switchable by means of a reference resistor. The programmable current mirror acts as a current source that sets the operating current and thus defines the operating point of the transistor arranged in a common-gate or common-base connection. Such arrangements having a transistor in a common-gate or common-base connection and a current mirror are generally referred to as current mirror with cascode.

In an advantageous variant, the device for setting the operating current of the transistor circuit comprises a constant-gm circuit that compensates for temperature influences by keeping the transconductance of a reference transistor constant. The functioning of a constant-gm circuit is known from the literature (see for example in T. Lee, "The design of CMOS radio frequency integrated circuits", Cambridge University Press, 1998, pages 235-237). The constant-gm circuit makes it possible, in a simple manner, to achieve an operating behavior of the high-pass filter arrangement that is stable, in particular is independent of temperature influences.

The device preferably has means for generating different switching states which in each case bring about a different operating current. For this purpose, the constant-gm circuit may have a reference resistor, which determines the transconductance of a reference transistor and generates a constant reference voltage at an output of the circuit, which reference voltage controls the current mirror and brings about a constant operating current of the transistor circuit of the high-pass filter arrangement. The reference resistor of the constant-gm circuit is preferably of switchable design in order, in this way, to set the operating currents of the high-pass filter arrangement in a variable manner and to alter the limiting frequency of the high-pass filter arrangement.

In one variant, the high-pass filter arrangement may be used in combination with an amplifier circuit which, by way of example, is part of an optical receiver and is designed for radiofrequency signals, and said arrangement may be connected downstream of said amplifier circuit for the filtering of the signal. In a further variant, the high-pass filter arrangement is used in combination with a differential amplifier circuit, a high-pass filter arrangement in each case being connected to an output of the differential amplifier circuit. The output signal of the differential amplifier circuit filtered by means of the high-pass filter arrangements is then present as a differential signal at the outputs of the high-pass filter arrangements connected to the amplifier circuit.

The invention furthermore relates to an optical receiver having a switchable high-pass filter arrangement having the features mentioned. In this case, the high-pass filter arrangement may be connected downstream of an amplifier circuit of the optical receiver, which is part of the optical receiver. In this case, the high-pass filter arrangement is preferably connected to a differential amplifier circuit in order to filter the output signal of the differential amplifier circuit.

BRIEF DESCRIPTION OF THE DRAWINGS

The concept on which the invention is based will be explained in more detail below on the basis of a plurality of exemplary embodiments with reference to the figures, in which.

DETAILED DESCRIPTION OF THE EXEMPLARY EMBODIMENTS

Figure 1:
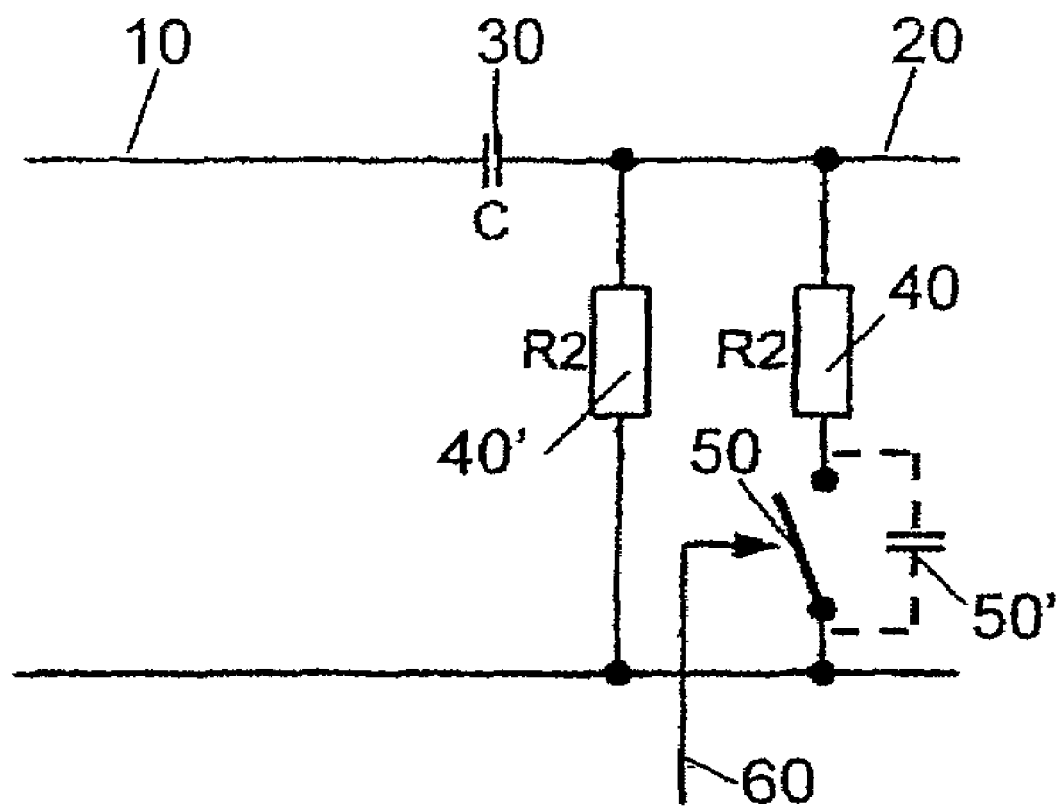
FIG. 1 shows a circuit diagram of a switchable high-pass filter arrangement in accordance with the prior art that is designed as an RC element.
Figure 2:
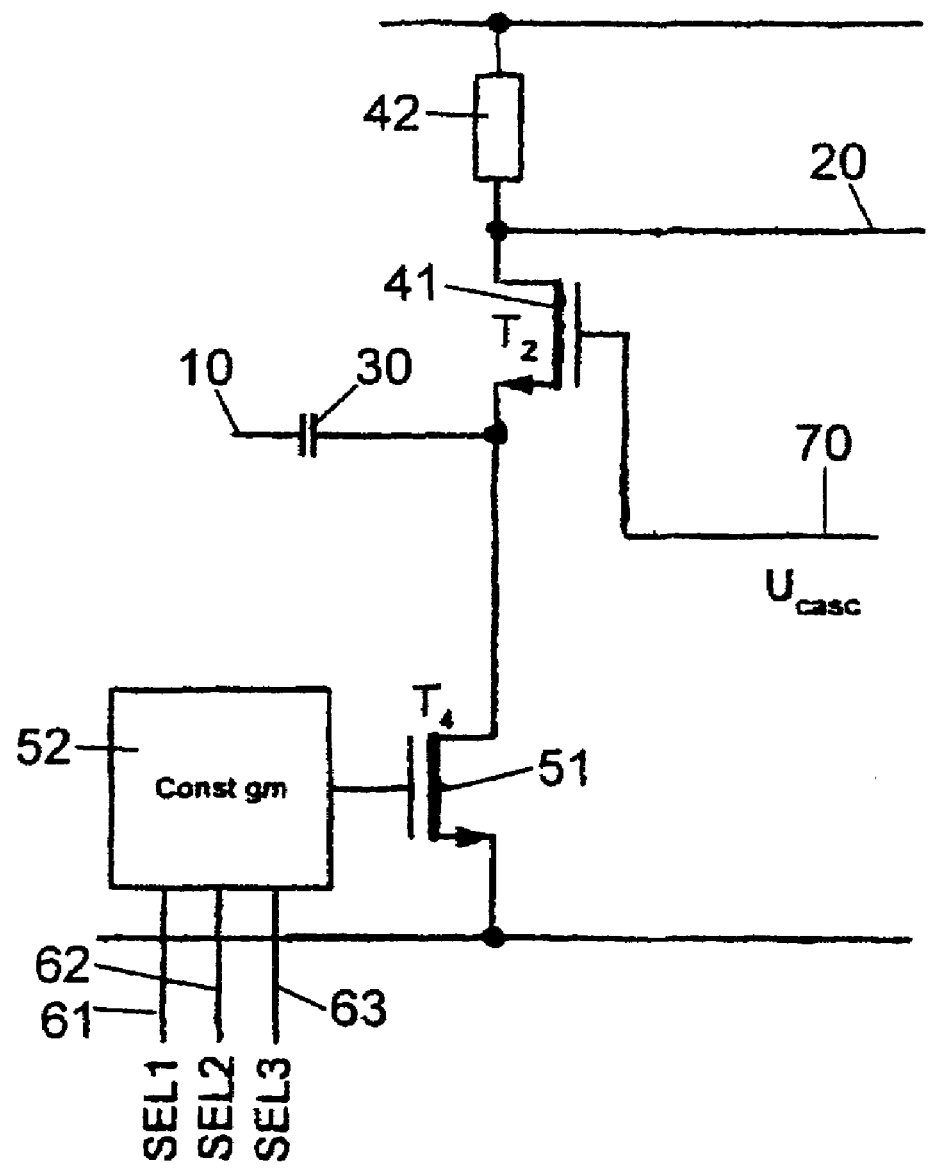
FIG. 2 shows a circuit diagram of a switchable high-pass filter arrangement with a transistor which is arranged in a common-gate connection and forms a cascode circuit together with a second transistor.

FIG. 2 shows a high-pass filter arrangement 1 having a MOS field effect transistor (MOSFET) 41 arranged in a common-gate connection and a capacitor 30 forming a capacitive component. The capacitor 30 represents the input 10 of the high-pass filter arrangement 1 and is connected in series with the source terminal of the MOSFET, while the drain terminal of the MOSFET forms the output 20 of the high-pass filter arrangement. A constant voltage $U_{casc}$ is present at the gate terminal 70 of the MOSFET 41 for the purpose of setting the operating point of the circuit. The drain terminal of the MOSFET 41 is connected via a resistor 42 to a supply line that is at a constant potential. The operating current of the MOSFET 41 is set by means of a second MOSFET 51, which is arranged in a common-source connection and forms a cascode circuit together with the MOSFET 41 in a common-gate connection. The second MOSFET 51 in a common-source connection serves for driving the MOSFET 41 in a common-gate connection and is controlled by a constant-gm circuit 52.

The high-pass filter arrangement 1 illustrated in FIG. 2 may likewise have, instead of the MOSFET 41 designed as a common-gate connection, a bipolar transistor arranged in a common-base connection without the arrangement behaving differently in principle. The high-pass filter arrangement 1 is often part of an integrated semiconductor circuit which has a multiplicity of electronic assemblies and is produced using a specific technology, so that the technology used for the underlying application decides what design is to be used for the high-pass filter arrangement. For a circuit using MOS technology, by way of example, a MOSFET 41 arranged in a common-gate connection is advantageously used, as in the high-pass filter arrangement in FIG. 2. However, the fundamental functioning of the high-pass filter arrangement is independent of whether common-gate or common-base connections are used.

Transistor circuits designed as a common-gate or common-base connection are known and described extensively in the literature (see for example U. Tietze, Ch. Schenk, "Halbleiter-Schaltungstechnik", [Semiconductor Circuitry], Springer Verlag, 11th Edition 1999). The input signal is present at the source terminal of the field effect transistor in the case of the common-gate connection and at the emitter of the bipolar transistor in the case of the common-base connection, while the output signal is tapped off on the drain side in the case of the common-gate connection and on the collector side in the case of the common-base connection. In both cases, the input impedance $R_{in}$ of the circuit is determined by the transconductance of the transistor used and corresponds to the reciprocal to the transconductance $g_m$:

$$R_{in} = \frac{1}{g_m}. \quad (1)$$

In the case of a field effect transistor using MOS technology, on the one hand, the transconductance of the transistor is given by $$g_m = \sqrt{2\mu_n C_{ox} \frac{W}{L} I_D}, \quad (2)$$

where $\mu_n$ denotes the charge carrier mobility (in this case for an n-channel transistor), $C_{ox}$ denotes the oxide capacitance, W/L denotes the width-to-length ratio of the transistor and $I_d$ denotes the drain current $I_d$ of the MOSFET. All quantities with the exception of the drain current $I_d$ in (2) are constant parameters predetermined by the geometry and the material of the transistor. In this case, the mobility $\mu_n$ is temperature-dependent but can be kept constant by means of the constant-gm circuit 52, by means of which the operating current is set.

In the case of a bipolar transistor, on the other hand, the transconductance is defined by $$g_m = \frac{eI_C}{kT}, \quad (3)$$

where e designates the elementary charge, k designates the Boltzmann constant and T designates the temperature and $I_c$ denotes the collector current.

In the case of the high-pass filter arrangement 1 illustrated in FIG. 2, the input impedance of the transistor 41 arranged in a common-gate connection, together with the capacitor 30—arranged in series with the input of the transistor circuit—with the capacitance $C_{in}$, determines the limiting frequency $f_{3\,dB}$ of the high-pass filter arrangement 1. The limiting frequency $f_{3\,dB}$ between non-influenced high-frequency and attenuated low-frequency signal components is defined as the frequency at which the arrangement effects a signal attenuation of 3 dB and below which the signal components are attenuated, and is given by $$f_{3dB} = \frac{1}{2\pi R_{in} C_{in}} = \frac{g_m}{2\pi C_{in}}. \quad (4)$$

Consequently, the limiting frequency of the high-pass filter arrangement 1 can be set by setting the operating current by means of the transconductance of the transistor 41 in accordance with equation (2). In the case of a high-pass filter arrangement with a bipolar transistor arranged in a common-base connection, the setting is effected analogously in accordance with equation (3).

The operating point is set by means of the setting of the operating current, which is switchable but exhibits static behavior between the switching intervals. A radiofrequency signal present at the input 10 of the high-pass filter arrangement 1 must have an amplitude which is small in comparison with the magnitude of the operating current set, so that the signal present essentially does not alter the operating point of the transistor 41. The signal behavior of the high-pass filter arrangement 1 can then be described by means of the so-called small-signal behavior of the transistor 41.

The operating currents are set, in the case of the high-pass filter arrangement illustrated in FIG. 2, by means of a MOSFET 51 which is connected to the source terminal of the transistor 41 arranged in a common-gate connection and which forms a cascode circuit together with the transistor 41. The transistor 51, together with a constant-gm circuit 52, serves as a bias circuit for the transistor 41 arranged as a common-gate connection, acts like a current source and thus defines the operating point and hence also the drain current of the transistor 41.

Figure 3:
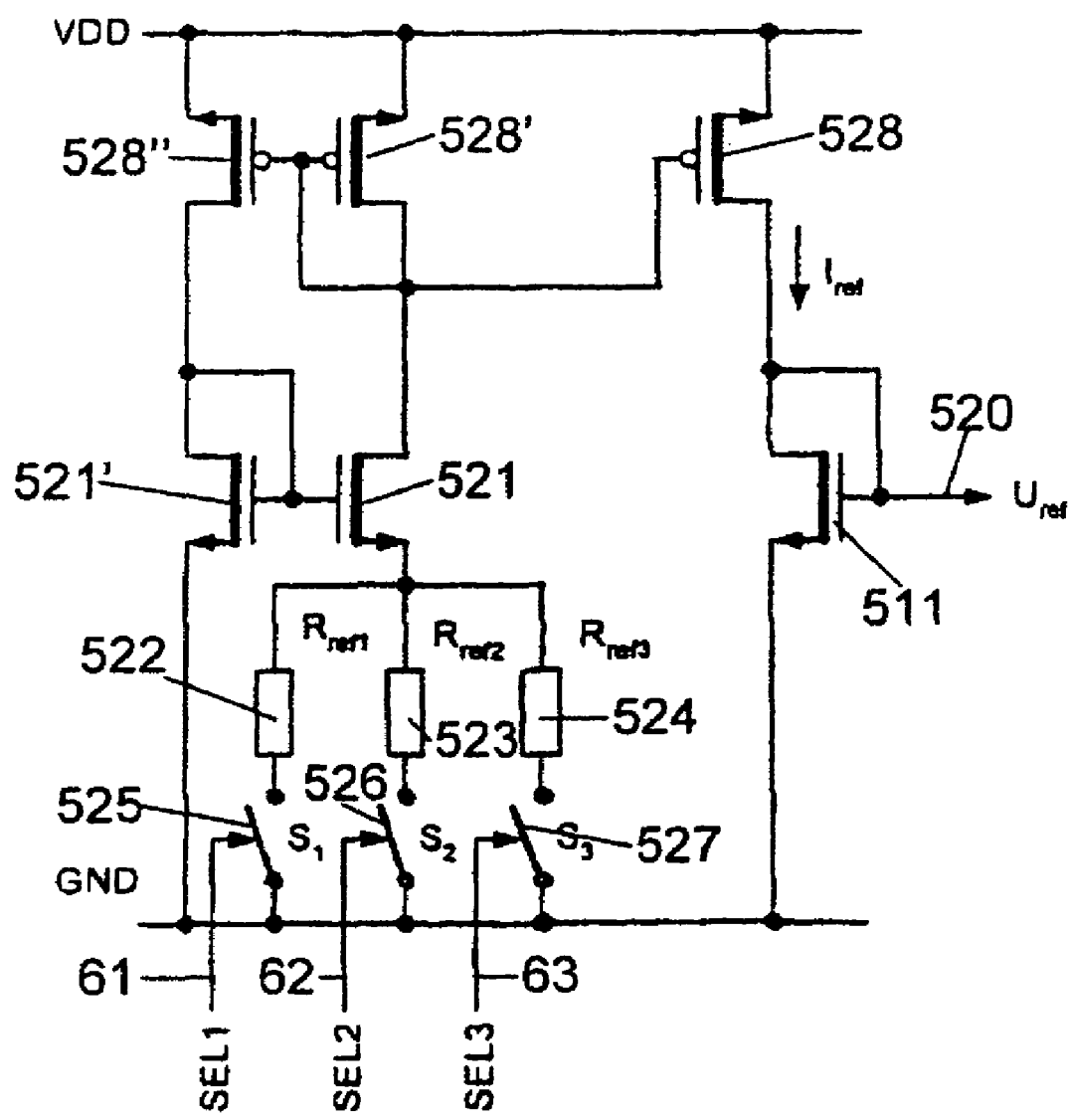
FIG. 3 shows a circuit diagram of a switchable constant-gm circuit with a programmable reference resistor arrangement.

The circuit diagram of the constant-gm circuit 52 is shown in FIG. 3. The method of operation of the constant-gm circuit 52 in detail is described for example in T. Lee,"The design of CMOS radio frequency integrated circuits", Cambridge University Press, 1998, pages 235-237. The constant-gm circuit 52 has a stabilizing effect and compensates for temperature influences by keeping the transconductance of a reference transistor 521' constant, and, by means of the current mirrors 528, 528', 528", 511, 51, stabilizing the transconductance of the transistor 41 arranged as a source follower and thus keeping the limiting frequency of the high-pass filter arrangement 1 constant. The transconductance of the reference transistor 521' is set by means of a reference resistor or a reference resistor arrangement having resistors 522-524, which is connected to a transistor 521 forming a current mirror together with the reference transistor 521', and corresponds to the reciprocal of the resistance of the reference resistor arrangement 522-524, which is switchable by means of the control lines 61-63 and the changeover switches 525-527. In this case, the transistor 521 is dimensioned to be very large, so that its effective resistance is small and the current through the transistor 521 is essentially defined by the resistors 522-524. The reference current $I_{ref}$ set by means of the current mirror 528, 528', 528" serves as the drain current of the transistor 511 and thus brings about a reference voltage $U_{ref}$ at the gate terminal of the transistor 511 which sets a constant transconductance of the transistor 41.

Improved circuit variants of the constant-gm circuit are possible and are described in detail in T. Lee, "The design of CMOS radio frequency integrated circuits", Cambridge University Press, 1998, pages 235-237.

The constant-gm circuit 52 is connected via the output 520 to the gate of the transistor 51 and provides a reference voltage $U_{ref}$ at the output 520 of the constant-gm circuit which sets a constant transconductance of the transistor 41. The transistor 51, which is connected to the source terminal of the transistor 41 arranged as a common-gate connection, acts together with the transistor 511 like a current mirror which is controlled by means of the reference voltage $U_{ref}$ and sets the drain current of the transistor 41 designed as a source follower such that the transconductance is constant independently of temperature influences. The reference voltage controlling the current mirror 51, 511 is switchable and variable by means of the reference resistor arrangement 522-524, and has the effect that the current mirror sets the operating current of the high-pass filter arrangement 1 depending on the set resistance of the reference resistor arrangement 522-524.

The constant-gm circuit 52 makes it possible, with simple means, to produce a temperature-stable, switchable device for setting the operating currents of the high-pass filter arrangement 1. Since the changeover switches 525-527 used for switching the reference resistor arrangement 522-524 are not situated in the signal path of the high-pass filter arrangement 1, they have no effects on the signal and the parasitic losses brought about by the changeover switches 525-527 are negligible.

Figure 4:
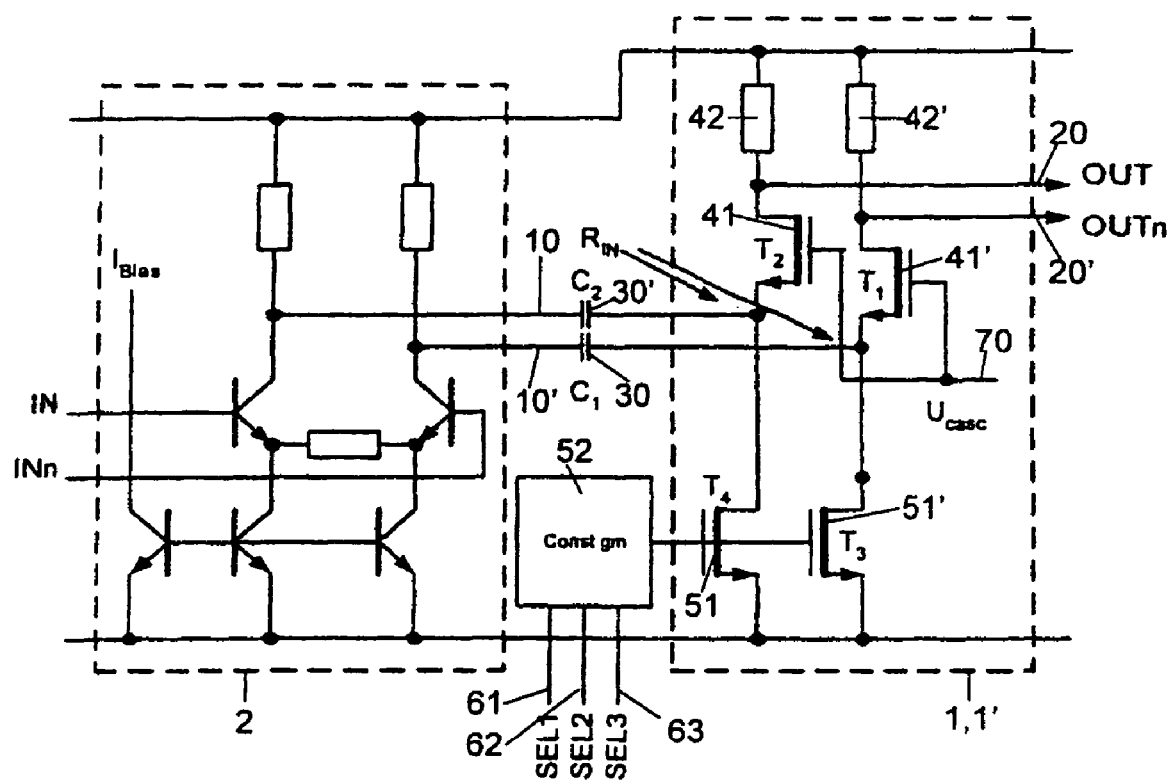
FIG. 4 shows a circuit diagram of a differential amplifier circuit with high-pass filter arrangements connected downstream.

FIG. 4 shows a circuit diagram of a differential amplifier arrangement 2, to the output paths of which is connected a respective high-pass filter arrangement 1, 1' with a transistor 41, 41' arranged as a common-gate connection. The differential output signal of the differential amplifier is present at the two inputs 10, 10' of the high-pass filter arrangements 1, 1' and is tapped off as a differential output signal at the outputs 20, 20' of the high-pass filter arrangements 1, 1'. Each high-pass filter arrangement 1, 1' has the components described above and inherently acts in the manner described above. The limiting frequency of the two high-pass filter arrangements 1, 1' is set by means of a constant-gm circuit 52, which is switchable by means of the control lines 61-63 and interacts with the transistors 51, 51' and defines the operating point of the high-pass filter arrangements 1, 1'.

The high-pass filter arrangement 1, 1' can be used in a multiplicity of integrated circuits as a switchable high-pass filter that can be produced in a simple manner. Over and above the exemplary embodiments described here, it is also possible to use the high-pass filter arrangement 1, 1' in cascaded form for producing higher-order high-pass filters which have a plurality of transistor circuits arranged in cascaded fashion. In addition to the application in optical receivers, a multiplicity of possible uses are conceivable, such as, for example, in equalizer circuits for fiber-optic applications or in optoelectronic amplifier circuits.

The invention claimed is:

1. A switchable high-pass filter arrangement configured to determine the high-pass filter behavior of the arrangement by a lower limiting frequency, comprising:
   a transistor circuit, comprising at least one transistor in a common-gate or common-base connection, wherein the transistor comprises a control terminal forming an input of the high-pass filter arrangement, and an output terminal forming an output of the high-pass filter arrangement;
   a capacitive component in series with an input of the transistor circuit; and
   a programmable device comprising a current source connected to the transistor circuit and configured to set an operating current of the transistor circuit by adjusting the current source;
   wherein a limiting frequency of the high-pass filter arrangement is switchable by means of the programmable device.

2. The arrangement of claim 1, wherein the programmable device comprises an additional transistor fed by a switchable voltage source and forms a cascode circuit together with the transistor of the transistor circuit in a common-gate or common-base connection.

3. A switchable high-pass filter arrangement configured to determine the high-pass filter behavior of the arrangement by a lower limiting frequency, comprising:
   a transistor circuit, comprising at least one transistor in a common-gate or common-base connection;
   a capacitive component in series with an input of the transistor circuit; and
   a programmable device configured to set an operating current of the transistor circuit, the programmable device comprising a programmable current mirror;
   wherein a limiting frequency of the high-pass filter arrangement is switchable by means of the programmable device.

4. A switchable high-pass filter arrangement configured to determine the high-pass filter behavior of the arrangement by a lower limiting frequency, comprising:
   a transistor circuit, comprising at least one transistor in a common-gate or common-base connection;
   a capacitive component in series with an input of the transistor circuit; and
   a programmable device configured to set an operating current of the transistor circuit, the programmable device comprising a constant-gm circuit configured to generate the operating current that is operable to compensate for temperature influences;
   wherein a limiting frequency of the high-pass filter arrangement is switchable by means of the programmable device.

5. The arrangement of claim 4, wherein the constant-gm circuit comprises switchable resistors that set the operating current of the high pass filter arrangement.

6. The arrangement of claim 1, wherein the programmable device comprises a means for generating different switching states for selling different operating current magnitudes.

7. The arrangement of claim 1, wherein the high-pass filter arrangement is coupled to an amplifier circuit.

8. The arrangement of claim 1, wherein a high-pass filter arrangement is coupled to an output of a differential amplifier circuit.

9. A high-pass filter arrangement, comprising:
   a transistor circuit, comprising at least one transistor in a common-gate or common-base connection, wherein the transistor comprises a control terminal forming an input of the high-pass filter arrangement, and an output terminal forming an output of the high-pass filter arrangement;
   a capacitive component coupled to the input of the high-pass filter arrangement, wherein the transistor circuit and the capacitive component cooperatively operate to substantially attenuate a signal below a limiting frequency thereof, and provide the attenuated signal at the output, wherein the limiting frequency is a function of transconductance of the transistor circuit and a capacitance of the capacitive component; and
   a bias circuit comprising a current source coupled to the transistor circuit, and configured to selectively vary an operating current associated with the transistor circuit by adjusting the current source, thereby altering the transconductance thereof and the limiting frequency of the high-pass filter arrangement.

10. The arrangement of claim 9, wherein the current source comprises a switchable current source configured to selectively set a plurality of discrete, different operating currents.

11. The arrangement of claim 9, wherein the bias circuit comprises:
   a transistor circuit, and a control terminal; and
   a transconductance control circuit configured to generate a control voltage at the control terminal of the transistor, wherein the control voltage is a function of a desired operating current of the transistor circuit.

12. The arrangement of claim 11, wherein the transistor is configured to generate the desired operating current based on the control voltage coupled thereto.

13. The arrangement of claim 11, wherein the transconductance of the transistor is kept stable by means of a current mirror and thereby keeping the limiting frequency of the high-pass filter arrangement constant.

14. The arrangement of claim 13, wherein the current mirror is operable to set a reference current for a reference voltage at the control terminal of the transistor.

15. The arrangement of claim 14, wherein the transconductance control circuit comprises:
   a current mirror circuit; and
   a variable reference resistor arrangement, wherein at least two transistors of the current mirror circuit are coupled with negative feedback by resistors of the variable reference resistor arrangement and is switch able by the reference resistor arrangement coupled to control lines and changeover switches.

16. The arrangement of claim 13, wherein the variable reference resistor arrangement is coupled to control lines and changeover switches, wherein the changeover switches are not situated in the signal path of the high-pass filter arrangement.

* * * * *